United States Patent
Giziewicz et al.

(10) Patent No.: US 9,294,197 B2
(45) Date of Patent: Mar. 22, 2016

(54) OPTOELECTRONIC COMPONENT

(75) Inventors: Wojciech Piotr Giziewicz, Berlin (DE); Thomas Albert Hall, San Jose, CA (US)

(73) Assignee: Amphenol Corporation, Wallingford, CT (US)

( * ) Notice: Subject to any disclaimer, the term of this patent is extended or adjusted under 35 U.S.C. 154(b) by 389 days.

(21) Appl. No.: 13/822,391

(22) PCT Filed: Sep. 12, 2011

(86) PCT No.: PCT/EP2011/004581
§ 371 (c)(1),
(2), (4) Date: Oct. 31, 2013

(87) PCT Pub. No.: WO2012/031780
PCT Pub. Date: Mar. 15, 2012

(65) Prior Publication Data
US 2014/0072311 A1    Mar. 13, 2014

(30) Foreign Application Priority Data
Sep. 12, 2010   (DE) .......................... 10 2010 044 836

(51) Int. Cl.
*H04B 10/40* (2013.01)
*G02B 6/42* (2006.01)

(52) U.S. Cl.
CPC .............. *H04B 10/40* (2013.01); *G02B 6/4214* (2013.01); *G02B 6/4243* (2013.01); *G02B 6/4246* (2013.01); *G02B 6/4253* (2013.01); *G02B 6/4274* (2013.01); *H01L 2224/32245* (2013.01); *H01L 2224/48091* (2013.01); *H01L 2224/48247* (2013.01); *H01L 2224/73265* (2013.01); *H01L 2924/1815* (2013.01)

(58) Field of Classification Search
CPC ........... H01L 2224/48091; H01L 2224/32245; H01L 2924/00014; H01L 2224/73265; H01L 2224/48247; H01L 2924/00; G02B 6/4246; G02B 6/4253; G02B 6/4274; H04B 10/40
USPC ...................................... 385/88–94, 147, 135
See application file for complete search history.

(56) References Cited

U.S. PATENT DOCUMENTS

| | | | |
|---|---|---|---|
| 5,369,529 A | 11/1994 | Kuo et al. | |
| 6,888,988 B2 | 5/2005 | Vancoille et al. | |
| 7,088,518 B2 | 8/2006 | Tatum et al. | |
| 2007/0147747 A1 | 6/2007 | Inujima et al. | |

FOREIGN PATENT DOCUMENTS

| | | |
|---|---|---|
| DE | 19932430 A1 | 2/2001 |
| EP | 1109041 A1 | 6/2001 |

*Primary Examiner* — Akm Enayet Ullah
(74) *Attorney, Agent, or Firm* — Blank Rome LLP

(57) ABSTRACT

This invention relates to an optoelectronic component which has the following: an optical component which emits optical signals to an input/output end face of a light guide and/or receives optical signals and converts them into electronic signals, a component carrier located on the optical component, and a housing part which surrounds the optical component and which has coupling means which form optical coupling means and mechanical coupling means (alignment means), the optical coupling means routing the optical signals coming from the optical component to the input end face of the light guide and/or routing the optical beams emerging from the input/output end face of the light guide to the optical component, the mechanical alignment means aligning the light guide with respect to the optical component for efficient signal transmission.

13 Claims, 9 Drawing Sheets

OPTOELECTRONIC COMPONENT

CROSS-REFERENCE TO RELATED APPLICATIONS

This application is a National Phase of Application No. PCT/EP2011/004581 filed Sep. 12, 2011, which claims the benefit of German Patent Application No. 10 2010 044 836.2 filed on Sep. 12, 2010, which are incorporated herein by reference in their entirety.

This invention relates to an optical coupling device and an optoelectronic component (for example an electro/optical (E/O) converter (transmitter) and/or an optical/electrical (O/E) converter (receiver) and a method for production.

Preferably the invention relates to an optoelectronic transceiver (in short: an optical transceiver) in which electrical-optical transmitting apparatus (which for example as an optical transmitter element have a VCSEL) and optical/electrical receiving apparatus (which for example as an optical receiving element have a photodiode) are used. While when using electrical transceivers the transmitting and receiving information is [transmitted] between two electrical transceivers by using electrical waves or signals, when using two optical transceivers the transmitting and receiving information is transmitted by optical waves or signals.

In the reception operating mode of a transceiver it converts the optical input signals which are supplied for example by a light guide, for example a glass fiber and which are transmitted on an optical transmission link into electrical signals which are then further processed in the optical transceiver itself and/or in connected circuits.

In the transmission operating mode the transceiver converts electrical input signals into optical signals which are to be transmitted on the optical transmission link. To do this the optical transceiver has an optical element which works as an E/O converter, for example a VCSEL laser.

In an optoelectronic component, for example a transceiver, there is the necessity of providing relatively efficient optical coupling between the optical transmitter element and the light guide, especially on the one hand (in the case of transmission) between the E/O converter which generates the optical signals and the light guide, for example between the input end face of a glass fiber, and also on the other hand (in the case of reception) between the optical signals which emerge from the exit surface of the light guide and which travel to the optical receiving element (O/E converter) which generates the electrical signals.

For example U.S. Pat. No. 6,560,385 discloses an optical coupling arrangement which uses a fiber optic prism 10 and has the following: A substrate 20 with at least one light element 24 and at least one waveguide 22 which is located over a substrate 20, furthermore there being a fiber optic prism 10. The fiber optic prism 10 receives light through the first side surface 12, reflects the received light from a third side surface 16 and transmits the reflected light from a third side surface 16 through a second side surface 14.

According to FIG. 3, the fiber optic prism 10 is arranged such that the first side surface 12 is located adjacent to the light element 24, and the second side surface 14 is located adjacent to the waveguide 22. The light element 24 can have a light-emitting device such as for example a LED or a VCSEL or a light receiving device such as for example a photodiode. One alternative arrangement is shown in FIG. 4 of the '385 patent.

Here it should be pointed out that the fiber optic prism is a separate component which must be produced separately and must also be calibrated when it is installed in the transceiver.

The object of this invention is to provide an optoelectronic component, coupling means being provided for an electro/optical transmitter and for an optical/electrical receiver as well as especially for an optoelectronic transceiver such that the calibration effort for the optical components, for example the optical element and the light guide, is low.

As claimed in the invention there are optical coupling means and a coupling device which has integrated light guide alignment (preferably 1-0 optical fiber alignment) and integrated mirror structures or integrated mirror properties.

As claimed in the invention the optical coupling means have both optical and also mechanical coupling means.

They can be made in the form of an optoelectronic semiconductor package, i.e. there is an optoelectronic component housing (semiconductor housing or housing part) which combines the feature of the optical fiber alignment (physical or mechanical light guide alignment) with the feature of beam deflection which ensures an almost vertical 20 beam incidence into the input end face of the light guide. Preferably this takes place in the beam deflection by means of collimation.

As claimed in the invention there is an optoelectronic transceiver which uses this optical coupling device and which can be built to be small enough to be usable in USB 1.0, 2.0, 3.0 plug-in connector technology.

As claimed in the invention the critical functions of fiber alignment and beam deflection and collimation are achieved in a single production step by molding of the optoelectronic component housing part or semiconductor housing part which forms the optical coupling device, no further active alignment step being necessary.

The optical coupling device which is made as claimed in the invention as a molded plastic body forms a first housing part of a component housing and shapes an enclosure with a second housing part or component carrier which bears an optical element. As claimed in the invention preferably the plastic body is molded directly on the component carrier which bears the optical component.

In the component housing or optoelectronic semiconductor housing (also called the semiconductor package) therefore an optical element, for example in the form of a VCSEL for the driver (optical transmitter) and/or an optical element in the form of a photodiode for the receiver, is accommodated, i.e. forms the optoelectronic semiconductor housing when it contains an optical transmitter and/or an optical receiver and optionally also other electrical circuits, an optoelectronic component as claimed in the invention, for example, and preferably, a transceiver.

As claimed in the invention the optoelectronic component housing or semiconductor housing which has the optical coupling device is achieved by efficient coupling between an optical fiber (light guide) and an optical element (transmitting and/or receiving element) preferably with a 90° beam deflection in that the coupling device provides optical fiber alignment and beam deflection as well as focusing, specifically by providing or molding a molded highly transparent plastic body which forms the optical coupling device (coupling means) directly on a component carrier which bears the active element(s). The plastic body forms the optical coupling means. Preferably the so-called "overmold packaging technology" is used for production.

Alternatively other plastic molding processes such as for example transfer overmolding with photocurable plastic can also be used.

As claimed in the invention the optoelectronic housing part (semiconductor housing) is made such that the plastic material or the overmold material is highly transparent and when the housing part is formed with a further material of a second housing part or component carrier it assumes a mechanical connection. The second housing part, as mentioned, can be a component carrier and bears an optical element and optionally other components or electrical circuits. The second component carrier is for example a substrate or a lead frame or a ceramic. When using the semiconductor housing or the optical component housing which has the coupling means as claimed in the invention, for example when installed in a plug-in connector, the latter is durable.

As claimed in the invention the plastic or the overmold plastic material which forms the housing part forms a reflector or reflection mirror which forms a reflection interface, preferably a total reflection interface for the light which can be transmitted between the optical element(s) positioned on the carrier and the entry end face of the light guide (and optionally vice versa). Preferably the reflection mirror which forms the reflection interface is an internal conical total reflection mirror.

As claimed in the invention the plastic on its interface to the ambient air forms the reflection mirror as a result of the transition from the plastic material with a higher index of refraction to the air with an index of refraction of 1.

Moreover it is preferably provided that the first housing part molded by the plastic especially by overmolding methods in its molding together with the component carrier forms an optoelectronic component housing which surrounds the optical element, i.e. encapsulates it, the optical coupling device acting as optical coupling means and mechanical coupling means, the latter preferably being provided as alignment means for the light guide. The alignment means are preferably formed by a V groove in the housing part. Preferred configurations of the invention will become apparent from the claims.

Other advantages, objectives and details of the invention will become apparent from the specification and exemplary embodiments using the drawings.

FIG. 1 shows a schematic side view of an optoelectronic component as claimed in the invention with an optoelectronic housing (or an optoelectronic semiconductor package) which has a first and a second housing part 10, in which there are an optical element and coupling means for light to and/or from a light guide;

FIG. 2 schematically shows two housing parts which are shown pulled apart and which form the housing of the optical component of FIG. 1;

FIG. 3 shows a schematic similar to FIG. 1, here its being assumed that the electrooptical component as one configuration of the invention is an optoelectronic transceiver in which there are an internal conical total reflection mirror which is formed by the first [sic] from a preferably highly transparent plastic for the optical connection between the optical receiver/optical transmitter and the light guide and furthermore alignment means for the light guide;

FIG. 4 schematically shows an electrooptical converter (transmitter) with its preferred dimensions, in the transmission operating mode a light beam emerging from a VCSEL being collimated and reflected toward one input end face of the light guide by a reflection surface formed by the first housing part;

Figure 3:
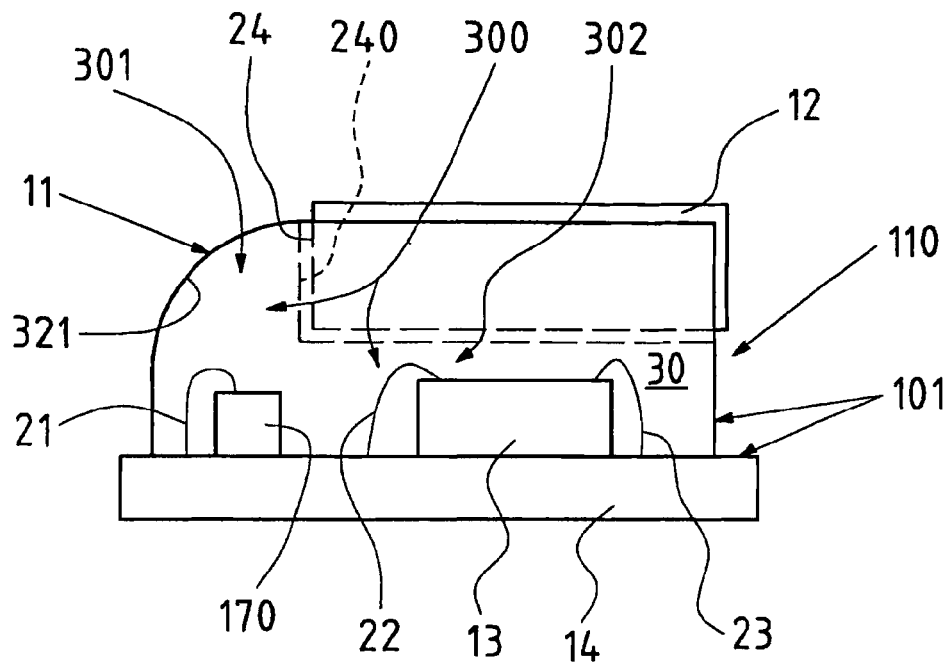
Figure 8:
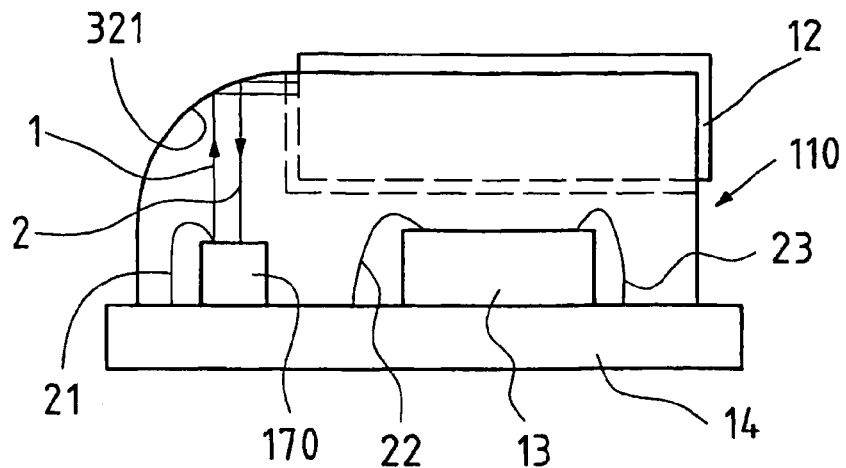
Figure 9:
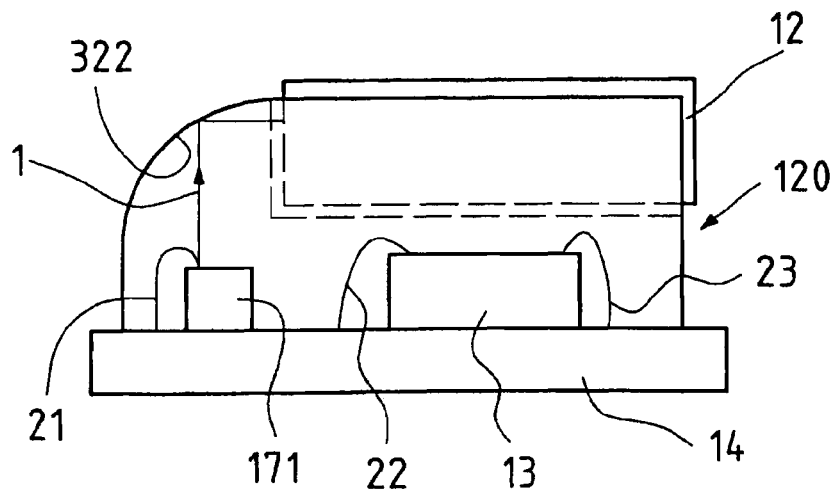
Figure 10:
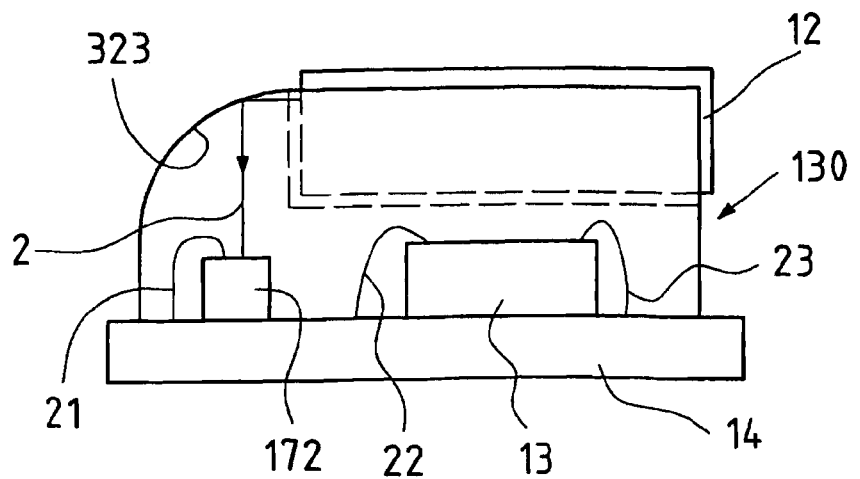
Figure 11:
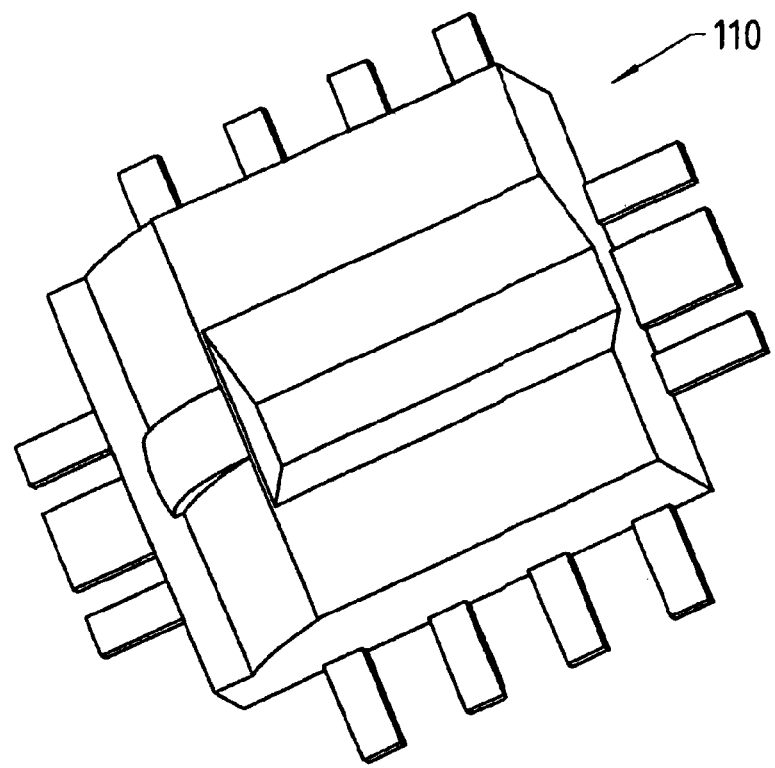
Figure 12:
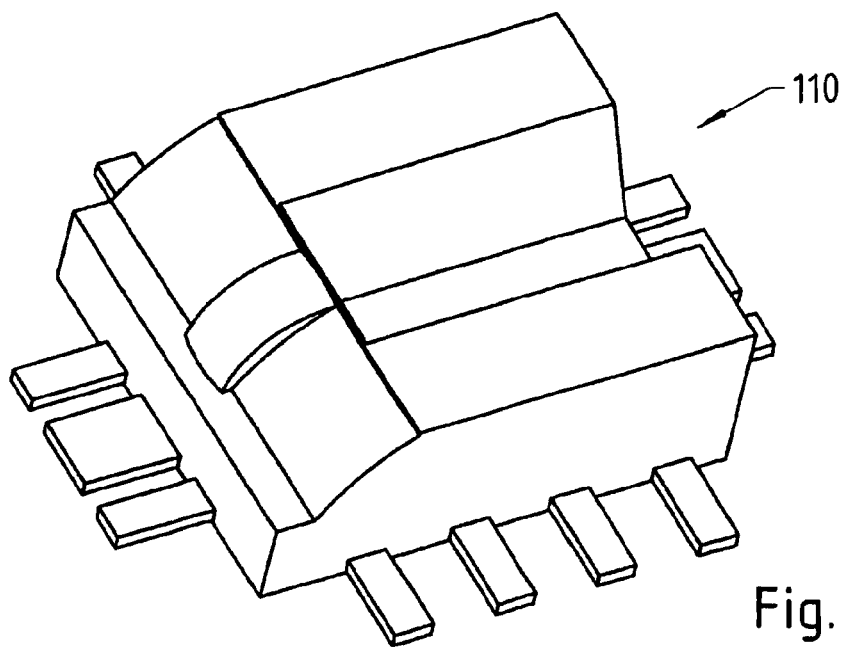
Figure 13:
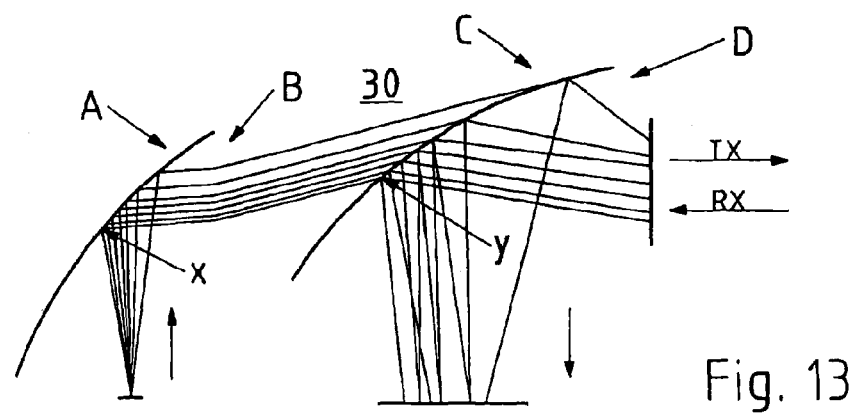
Figure 14:
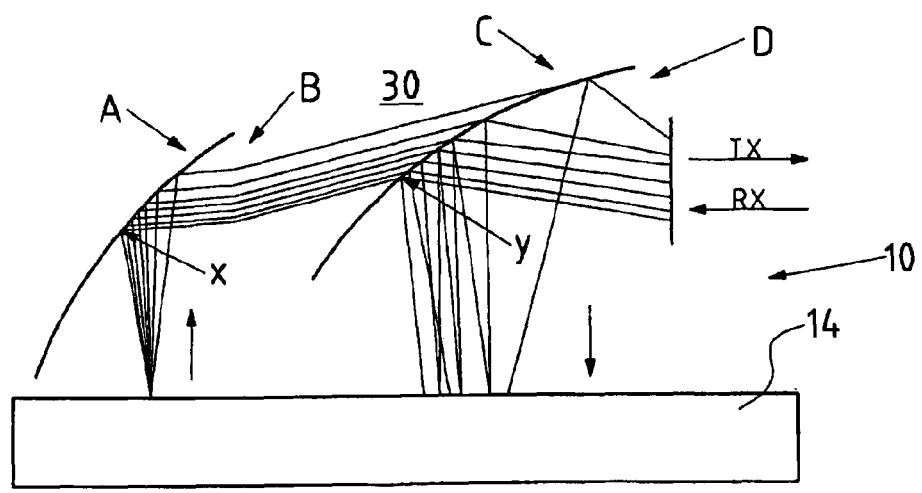
Figure 15:
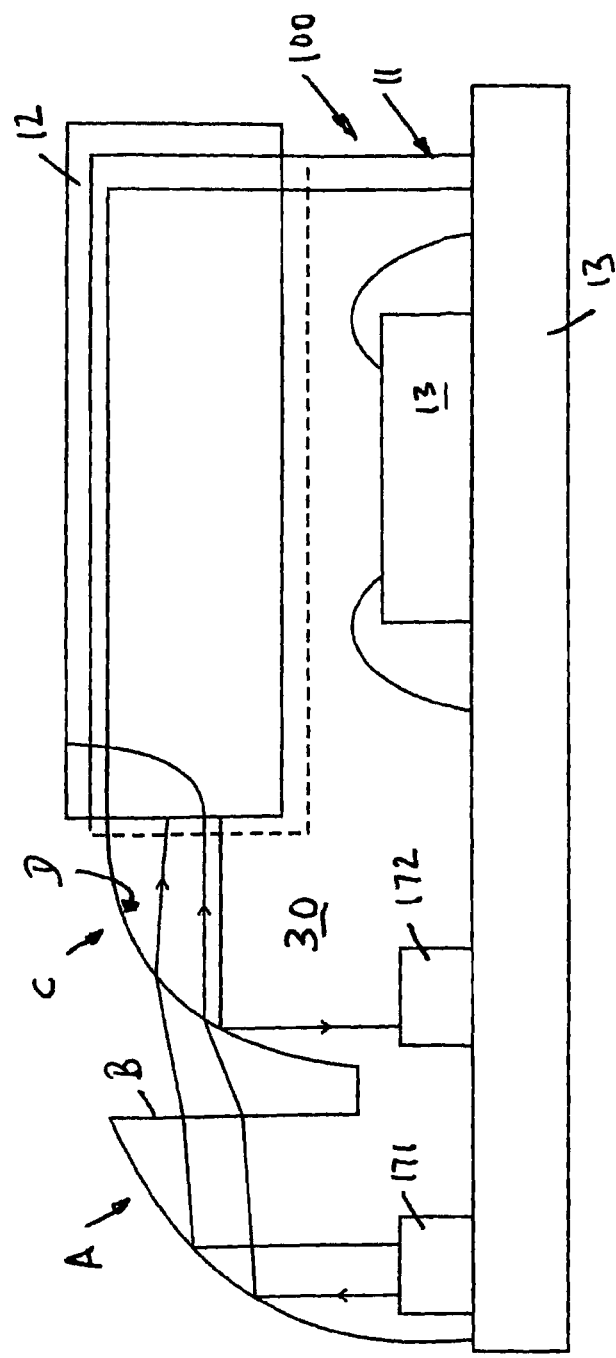
Figure 16:
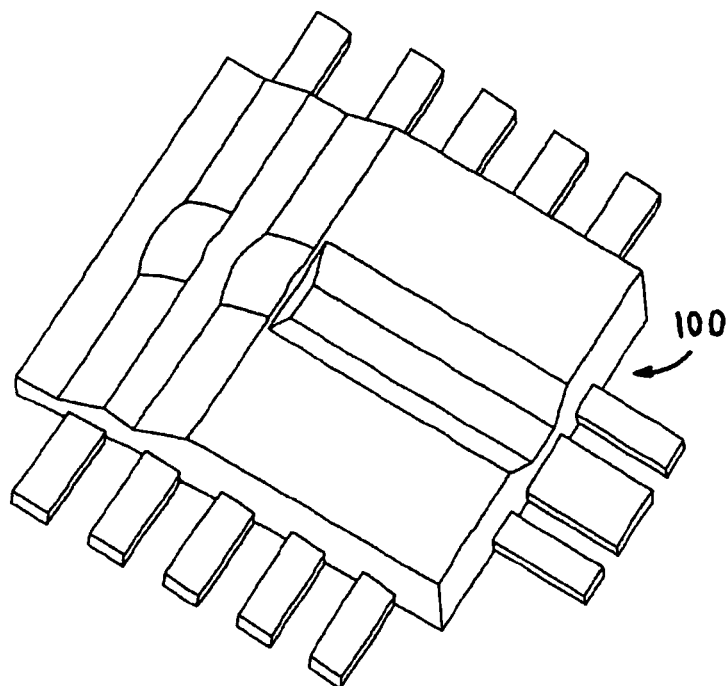

FIG. 8 schematically shows analogously to FIG. 3 a transceiver with its schematically shown light transmission links;

FIG. 9 is similar to FIG. 8, but shows an electrooptical transmitter;

FIG. 10 is similar to FIG. 8, but shows an electrooptical receiver;

FIG. 11 is a perspective plan view of an optoelectronic component made as claimed in the invention, for example a transmitter, a receiver or a transceiver according to FIGS. 3 to 10; and FIG. 12 shows the component of FIG. 11 from another perspective;

FIGS. 13 and 14 schematically show the invention with two reflection surfaces, formed by the optoelectronic component and its coupling means;

FIG. 15 shows a schematic view of the beam progression for a receiving beam and a sending beam similar to FIGS. 13 and 14;

FIG. 16 shows schematic views similar to FIGS. 11 and 12, but here there being two reflection surfaces at a time, formed by the component housing.

Figure 17:
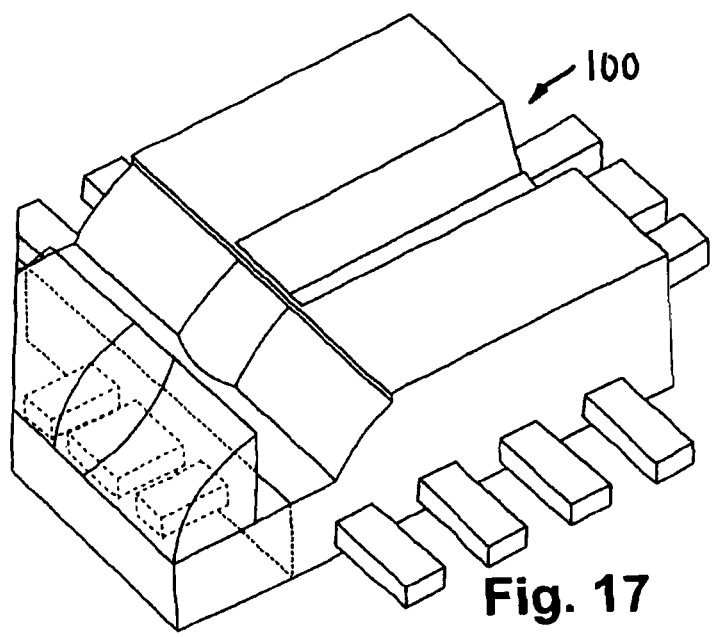

FIG. 17 shows in general an optoelectronic component 20 (for short: component) 10 as claimed in the invention with an optoelectronic housing which can also be called a capsule, the housing and the capsule 9 enclose at least one optical element 17 and optionally others. Coupling means 300 provide for an efficient connection or coupling between the optical element 17 and a light guide (for example a glass fiber) 12 which interacts with it. As claimed in the invention the coupling means 300 are provided by a coupling structure, especially by the shape or execution of the housing 9 such that at the same time optical coupling by optical coupling means 301 and mechanical coupling and alignment by mechanical coupling/alignment means 302 between the optical element 17 and the light guide 12 are achieved. The coupling means 300 cause a 90° change in the optical path and a passive alignment of all elements, especially of the optical element 17 and the light guide 12 of the component 10.

The housing 9 consists essentially of two housing parts, a first housing part 1 and a second housing part 14 which bears the optical element 17. The first housing part 11 forms essentially the coupling means 300 which on the one hand produce the optical connection (an optical transmission link) between the light guide 12 and the optical element 17 (by the optical coupling means 301) and the alignment (by the mechanical coupling/alignment means 302) for the light guide 12, especially its inlet/outlet surface 24, 25.

The second housing part 14 can be a carrier and specifically preferably as shown in the form of a lead frame (substrate) 14. The optical element 17 is connected by wire bonds 21 to the conductors of the second housing part 14 in order in this way, as shown in FIGS. 3-6, to produce an electrical connection for example to an ASIC 13 which is likewise located on the second housing part 14. The ASIC and possibly the optical element 17 could also be mounted with a flip-chip method.

By a method of encapsulation, especially of overmolding (or another method), as claimed in the invention the first housing part 11 consisting of a highly transparent plastic material 30 is formed and connected to another material, specifically the material of the second housing part 14 by the overmolding injection method. The first housing part 11 with the second housing part 14 which bears the optical element 17 forms the optoelectronic component 10.

The first, especially overmold housing part 11 and the second housing part 14, i.e. form the housing when they encompass an optical element 17, a capsule, i.e. an optoelectronic semiconductor housing or an optoelectronic semiconductor package.

Figure 5:
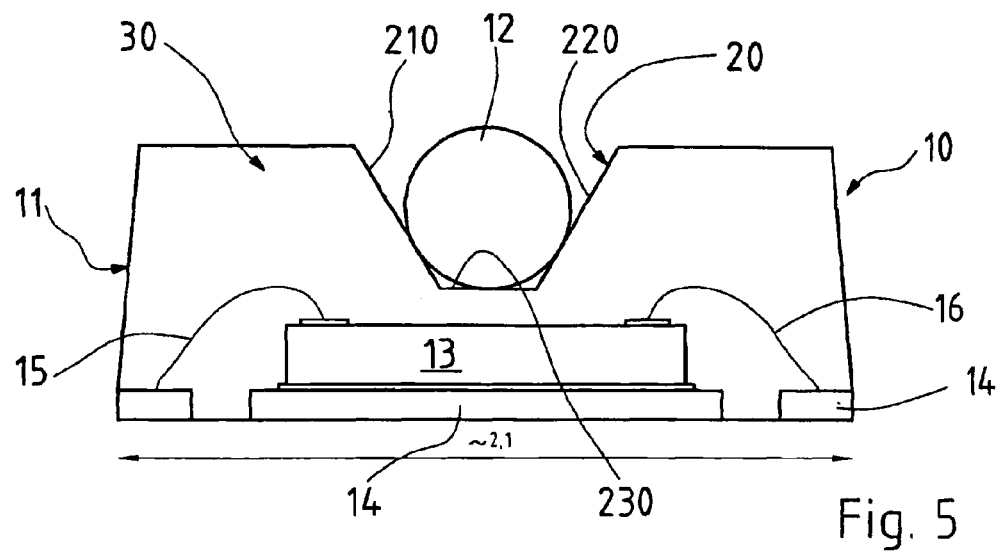
FIG. 5 shows a schematic cross section of the optical component, especially of the optical transmitter of FIG. 4 and from the right in FIG. 4 roughly along the line A-A in FIG. 6, the alignment means only suggested in FIG. 4 formed by the first housing part in the form of an alignment groove for the light guide being clearly visible.

The coupling means 300 and the mechanical coupling/alignment mean 302 furthermore form, as clearly shown in FIG. 5, a light guide alignment groove or fiber alignment groove 20 for accommodating the light guide 12. The groove in the illustrated exemplary embodiment is formed by two obliquely running side walls 210, 220 and a lower wall 230. The fiber alignment groove 20 furthermore has a rear wall 240.

Figure 1:
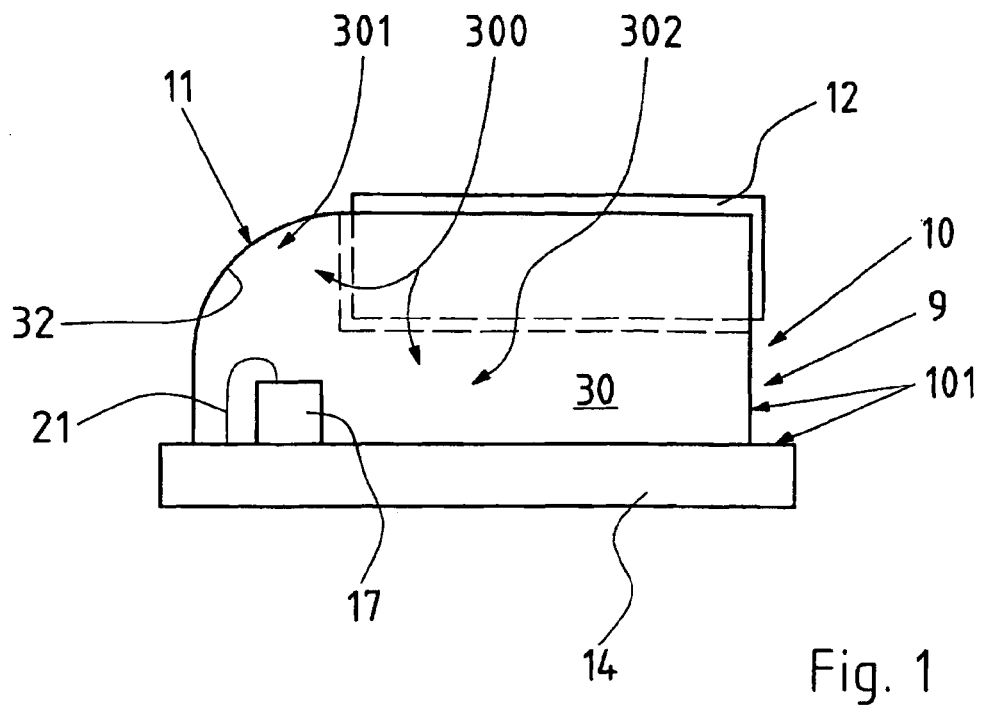

FIG. 1 therefore in general shows an optical component 10 which, depending on how the optical element 17 is made, can operate as a transceiver 110 as illustrated in FIG. 8, as a transmitter 120 as illustrated in FIG. 9 or as a receiver 130 as illustrated in FIG. 10, and there can be electrical circuits, for example an ASIC 13, which interoperate with the optical elements 170, 171, 172. The ASIC 13 is connected by wire bonds or connecting wires 22, 23 to conductors in the second housing part 14. The optical element 17 is also connected to a conductor of the second housing part 14.

In the case of a transceiver 110 (compare FIGS. 3 and 8) the optical element 170 comprises both a transmitter and also a receiver and is connected to the optical fiber 12 via a sending transmission path or sending beams 1 and a receiving transmission path or receiving beams 2. In the case of FIG. 9 the optical component is a transmitter or sender 120 and as the optical element has an optical transmitting element 171 (for example a VCSEL) which is connected to the light guide 12 via a sending beam 1. The optical component 130 in FIG. 10 is a receiver 120, the optical element being for example a photodiode 172 which receives a receiving beam 2 which comes from the light guide 12.

Figure 2:
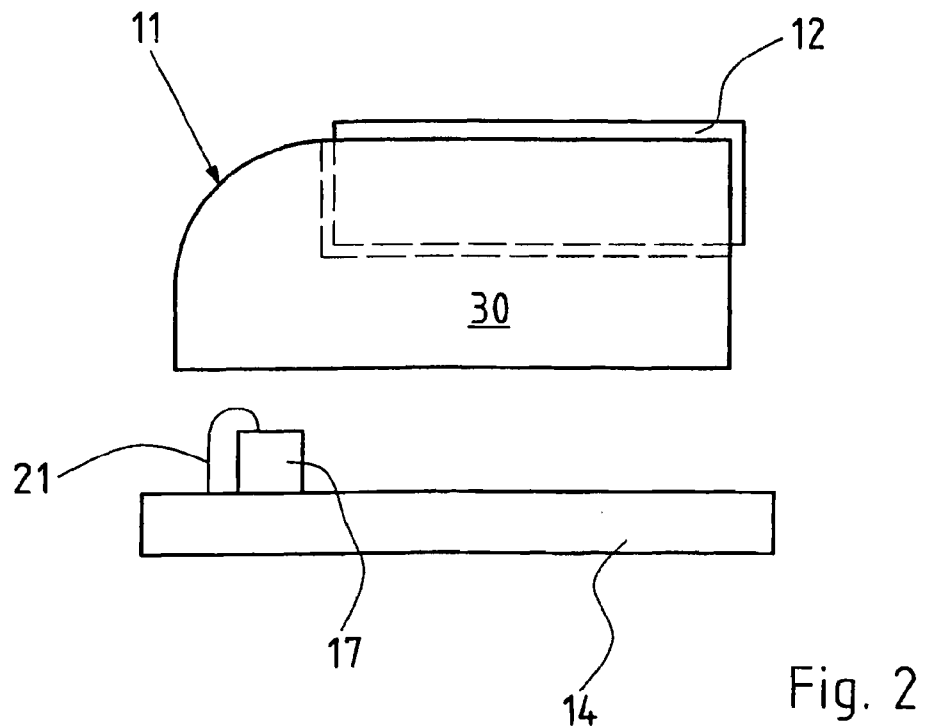

It should be noted regarding FIG. 2 that here the two housing parts, i.e. the first housing part 11 and the second housing part 14, are clearly shown.

In the following the invention is described especially with reference to FIGS. 3 to 7 and 11 and 12, especially with respect to the fact that the optical component is a transceiver 110 which can be advantageously used in a USB 3x plug-in connector as claimed in the invention and especially in a socket of a transmitting/receiving apparatus which via a corresponding cable which also has light guides is connected to another apparatus which likewise has a corresponding socket.

FIG. 3 shows that the transceiver 110 as claimed in the invention is fundamentally structured such that the optical component 10 according to FIG. 1 is replaced here by the optical element 170 which comprises a transmitting apparatus and a receiving apparatus; this is not shown in particular in FIG. 3.

Furthermore, as in the general case of FIG. 1, the plastic material, especially the overmold material 30, forms the coupling means 300 between the optical element 170 and the light guide 12. The coupling means 300, as mentioned, have optical coupling means 301 and mechanical coupling means 302. The optical coupling means 301 form a reflector with a reflection surface 321, preferably in the form of a conical mirror with internal total reflection by the material 30 on the interface to the air. The reflection surface 321 is made such that both the optical transmitting beams and also the optical receiving beams are efficiently deflected by the reflection surface 321.

Figure 4:
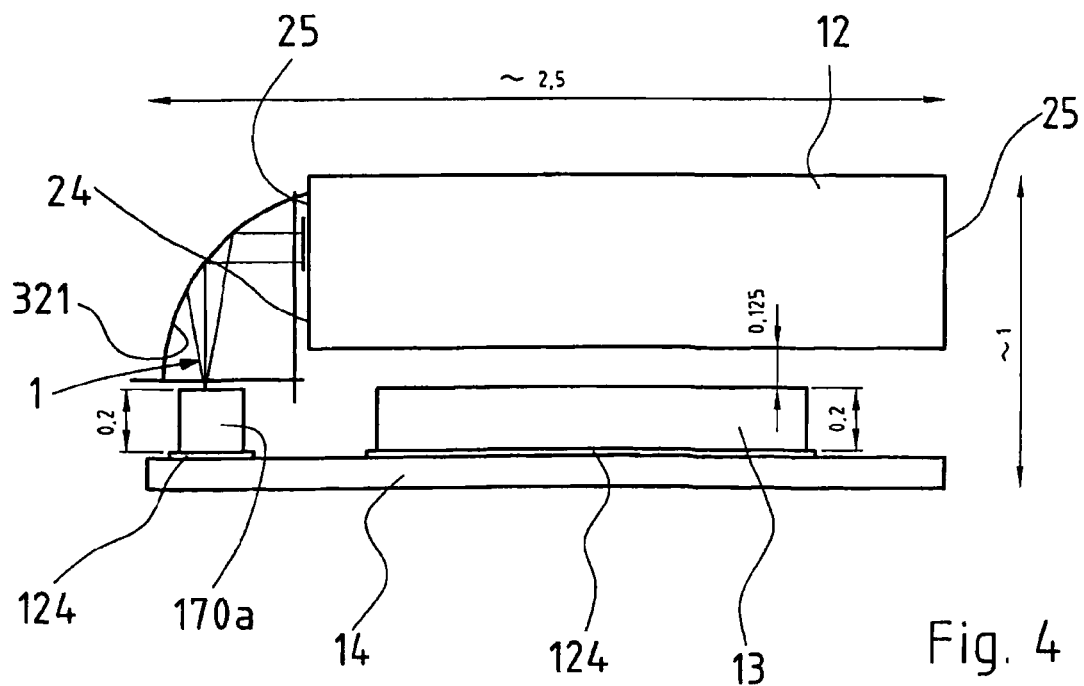

As indicated in FIGS. 4 and 5, the first housing part 11 and the second housing part 14 each have a longitudinal extension on the order of 2.5 mm and the width is roughly 2.1 mm. Due to these small dimensions, the use of a component 10 as claimed in the invention which is made as an optoelectronic transceiver 110 is advantageous especially in the formation of a socket for USB 3x connections since the optoelectronic transceiver can be used together also with the existing USB 3.0 sockets and the USB 2.0 sockets which do not provide any optical transmission (backward compatibility).

As is shown in FIG. 4, the beam 1 which has been emitted from the optical transmitting/receiving element 170, for example in the transmission operating mode from a VCSEL 170a, is reflected from the reflection surface 321 of a reflector formed by the housing part 11, which surface has been formed by the first housing part 30, and in doing so is collimated and then is incident essentially vertically on the input end face 24 of the optical fiber 12 in order to be relayed by it. The optical fibers or the light guide 12 can be a single mode or multimode light guide.

Therefore as claimed in the invention the optical component 10 and in the case of FIGS. 3-8 and 11 and 12 the entire optoelectronic transceiver 110 are formed by the first housing part together with the second housing part which bears the optical element and circuits. Here the optical fiber alignment and the preferably 90° beam deflection and collimation are integrally achieved by the first housing part 11, preferably the overmold housing part and the second housing part 14 of the transceiver 110.

The optoelectronic semiconductor package therefore comprises the first housing part 11 and the second housing part, for example the lead frame 14, then together with a driver and/or a receiver as well as an ASIC, the optical component 10, in the case of FIG. 3 the optical transceiver 110, being formed.

The lead frame 14 is typically a metallic punched part on which the chips, such as for example the optical element 170; 170a and the ASIC 13 are fastened by die bonds 124 and with which wire bonds 21-23 make contact. After bonding, the lead frame 14 is typically coated with a duroplastic and its terminal legs are punched free and optionally angled. The separate coating with a duroplastic can be omitted as claimed in the invention.

Figure 6:
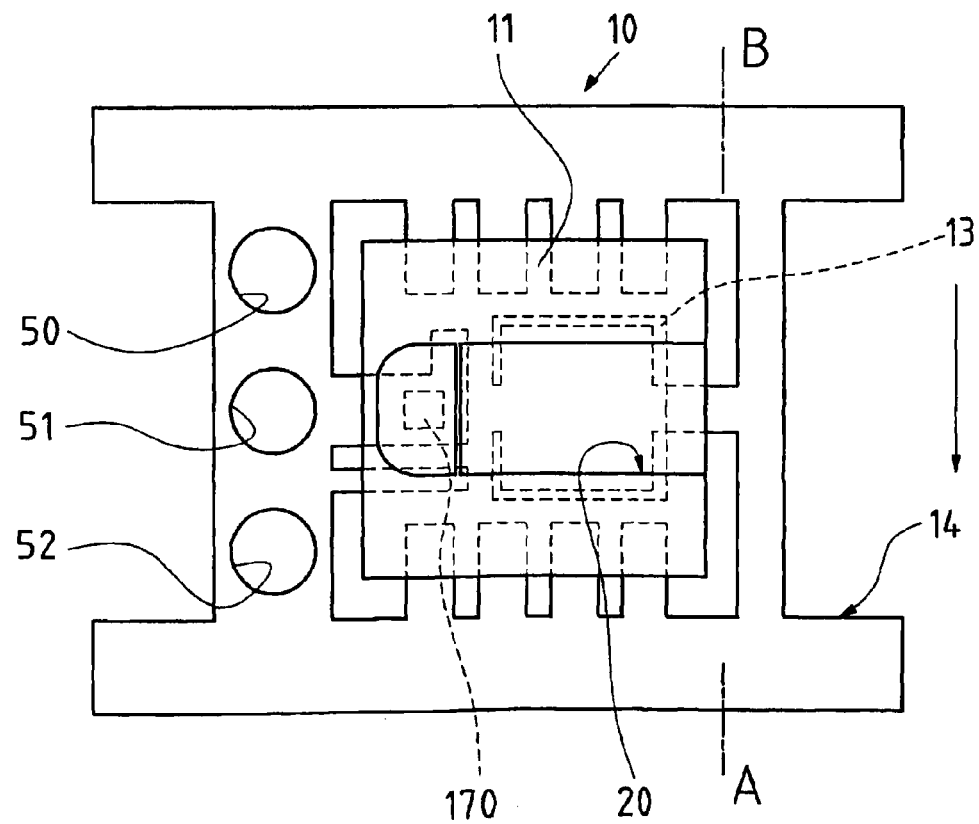
FIG. 6 shows a schematic plan view similarly to FIG. 11 of a component according to FIG. 5 on a terminal sheet.
Figure 7:
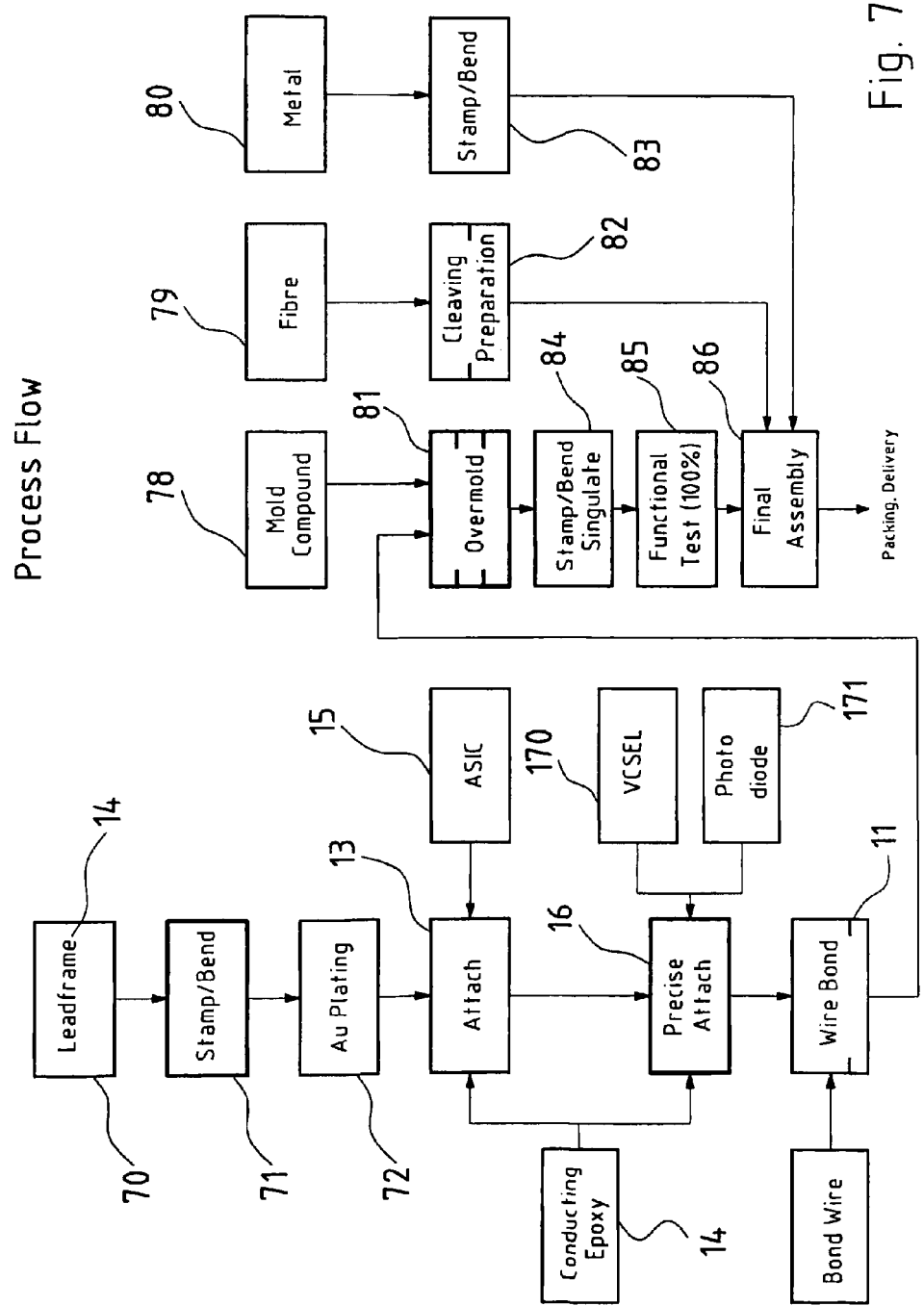
FIG. 7 shows a flow chart of the method as claimed in the invention for producing an optoelectronic transmitter or receiver or transceiver.

FIG. 6 shows a schematic plan view of the arrangement according to FIG. 4. In the initial punching of the lead frame 14 as claimed in the invention two or more alignment openings or holes 50, 51, 52 are punched out near the fastening region of the optical element 170. Using a die bonder the optical element 170 is arranged with high precision at a predetermined location with respect to the alignment openings 50-52. Thereupon the component carrier which is made as a lead frame 14 is especially "overrmolded", i.e. coated with the overmold material 30 of the housing part 11, as a result of which the overmold material 30 or the overmold housing part 11 is aligned with the component carrier 14, preferably in the form of the lead frame 14 using the alignment openings 50-52. There are also possible alternative "overmolding" technologies, for example stamping/embossing, UV methods (for example similar to thin fusion), but with the focus on "transfer overmolding".

The tolerance chain for the characteristic of the optical radiation between the optical element 170 and the light guide or the optical fiber 12 is therefore the following: the placement accuracy (of the chip which forms the optical element 17 or 170 or 171 or 172) and the alignment accuracy of the overmold housing part 11+mold material quality must be considered.

Since the fiber alignment feature lies in the overmold housing part (or the mold material) itself, only the mold tooling influences the mold repeatability and the alignment accuracy with the reflection surface 32 and 321 in the case of the transceiver 110.

The steps as claimed in the invention for producing the electrooptical transceiver 110 as claimed in the invention and its coupling means are shown in FIG. 5.

In step 70 the lead frame 14 is prepared and in step 71 the corresponding printed conductors are punched and the lead frame 14 is optionally subjected to a bending process. In step 72 the lead frame 14 is plated for example with gold, then in step 73 the ASIC 75 being fastened to the lead frame 14 by a conductive epoxy resin by means of die bonding 24. In step 76, likewise using the conductive epoxy resin, the precise fastening of the optical element 170, for example a VCSEL, as shown in FIG. 4, or a photodiode which is not shown takes place.

After the step 76 of precise alignment, in step 77 the wire bonds, for example 21, 22, 23, are attached.

Step 81 is the overmold method step. In this step 81 the overmold material (mold compound) which is kept available in step 78 is injected via the lead frame 14 with the optical element 17 or 170 and ASIC 13 mounted on it, specifically with formation of an internal reflection mirror with the reflection surface 321, preferably of an internal conical total reflection mirror with the reflection surface 32.

In step 84 a punch/bend detachment takes place in the production of the transceiver 110 on a conveyor belt.

In step 85 the functions of the optical transceiver 110 are tested. In step 86 the final assembly for the light guide 12 which was prepared in step 79 is undertaken, optionally an additional metal housing which has been made available in step 80 and 83 being attached in step 86, like the likewise prepared metal after steps 82 and 83 in final assembly.

FIGS. 11 and 12 show outside views of the transceiver 110 which is shown and described in FIGS. 3-7.

Let it be noted that instead of "overmolding" also the word "encapsulation" could be used in order to express the fact that other molding methods can also be used. A bidirectional version is also possible.

Based on the aforementioned, the invention calls for an optoelectronic component 100 which in addition to a reflector D has another conical reflector B which is likewise formed by the optical coupling means 30. The left-hand reflector A embodied in FIGS. 13-17 is an additional feature of this invention. The additional reflector A, as shown in FIGS. 13-17, is located downstream of the reflector C. The combination of the two reflectors works as explained below.

The two reflectors A, C are formed by the above described first housing part 11 which is molded such that it forms the respective reflection surfaces x, y.

It is apparent that the receiver 172 receives the light entering through the optical fiber (optical fiber core) via the surface D. As a result of internal total reflection, the light is reflected away on the conical surface C and in this way is turned by 90° and roughly collimated. It is then incident on the photodiode and the photodetector 672 underneath the reflector C, within the first housing part 11 especially of the overmold compound or the overmold plastic. The emitter 171 on the other hand (VCSEL) emits the light which is incident on the conical reflector surface A. The beam is turned (by less than 90°) and collimated in part as a result of internal total reflection. The beam emerges from the first housing part 11, especially the overmold plastic, through the surface B and again enters the housing part 11 through the conical surface C. C and D effectively form a spherical planar convex lens.

One noteworthy feature of the invention is that the VCSEL photodiode feedover should be essentially zero, and potential contributions only from scattering as a result of the surface roughness could occur. Reference is made to the following important points.

In the prior art the "transparent transfer overmolding" is known for example in the field of LED packaging.

In the invention it is advantageous that the overmold offers a protection function in the sense of a housing, specifically relative to mechanical forces and ambient influences such as for example water.

With respect to the production method, it should be noted that the "die bond" and then "wire bond" of the ASIC and possibly also the OE components could be mounted in a flip-chip method. Furthermore instead of a "lead frame" also other substrate materials such as for example FR-4 or ceramic could be used.

It should be emphasized that the invention relates not only to one transmission direction, but, as explained, also two optoelectronic components and one or two ASICs, furthermore two mirrors and two fiber trenches can be used.

Although the focus is on the "transfer overmolding" there are possible alternative "overmolding" technologies, for example stamping/embossing as well as UV methods.

In particular it should be noted for the invention especially according to FIGS. 13 to 17 that the invention achieves the miniaturization of the optoelectronic transceiver and also the number and size of the components in an optoelectronic transceiver are reduced. Essentially the optical transceiver comprises an optical transmitter 171, an optical receiver 172 and coupling means 300 consisting of a first and second optical lens, compare FIG. 15, for changing/deflecting optical paths of on the one hand optical output signals of the optical transmitter 171 to a connectable optical light guide 12 and on the other hand of input signals of the same light guide 12 to the receiver 172, in particular as claimed in the invention the first lens having a concave reflection surface which lies inside in the coupling means 300 for signals of the optical transmitter and the second lens forming a concave reflection surface which lies inside for incoming signals via a convex transmission surface which lies outside for outgoing signals of the optical transmitter. The position of the lenses which have been formed in this way to one another is provided such that efficient transmission both of the transmitting and also the receiving signals takes place. The material which forms the coupling means preferably has an index of refraction of >1.3. Furthermore the inner surface of the second lens is made with a radius of curvature such that the condition of total reflection is satisfied, and specifically with reference to the optical paths of optical signals which are incident on the interface from the light guide 12. Furthermore material with an index of refraction of >1.3 can be used, the inner surface of the first lens being made with a radius of curvature such that the condition of total reflection is satisfied with respect to optical paths of optical signals which are incident on the interface from the transmitter 171.

In the production method as claimed in the invention, the alignment of the photoelements is already ensured in the production process, the deflection of the light being achieved by the coating, i.e. the overmold material. In this way, a finished unit closed in itself is produced in which the light reflecting angle always occurs vertically or in the direction of the optical axis regardless of the location and position of the circuit board. Moreover the mirror effect is intensified or improved by the mirror curve, also called "conic mirror", being made such that no point light beams, but rather a spot of light is achieved and thus is coupled reliably into the fiber optics.

Regarding the invention shown especially in FIGS. 13 to 17, it should be noted that the two reflectors work as follows. The light which enters the overmold material from an optical fiber travels to the receiver through the surface D. As a result of internal total reflection the light is reflected from the conical surface C and thus is deflected by 90° and roughly collimated. It is then incident on a photodiode which is located underneath the reflector within the overmold material 30. With regard to the emitter, the light emitted from a VCSL will be incident on a conical reflector surface A. Here the beam is turned by (less than 90°) and partially collimated, and specifically as a result of the internal total reflection. The beam then emerges from the overmold material through the surface B and enters again, specifically through the conical surface C, and finally emerges through the surface D. As already mentioned, C and D effectively form an eccentric aspherical planar convex lens.

It should be noted that instead of "overmolding" also the word "encapsulation" could be used in order to express the fact that other molding methods can also be used. A bidirectional version is also possible.

Based on the aforementioned, this invention calls in addition for another conical reflector next to the reflector as was described in the aforementioned. In FIGS. 13-17 the left-hand reflector A embodies an additional feature of this invention. The additional reflector A, as shown in FIG. 5, is located downstream of the reflector C. The combination of the two reflectors works as explained below.

The two reflectors are formed by the above described first housing part which is molded such that it forms the respective reflection surfaces X and Y.

It is apparent that the receiver receives the light entering through the optical fiber (core) via the surface D. As a result of the internal total reflection, the light is reflected away on the conical surface C and in this way turned by 90° and roughly collimated. It is then incident on the photodiode and the photodetector underneath the reflector, specifically within the first housing part especially of the overmold compound or the overmold plastic. The emitter on the other hand (VCSEL) emits the light which is incident on the conical reflector surface A. The beam is turned (by less than 90°) and collimated in part as a result of internal total reflection. The beam emerges from the first housing part, especially the overmold plastic, through the surface B and again enters through the conical surface C and finally emerges through the surface D, C and D effectively forming a spherical planar convex lens.

One noteworthy feature of the invention is that the VCSEL photodiode feedover should be essentially zero, and potential contributions only from scattering as a result of the surface roughness could occur. This is not necessarily the case in other implementations where for example temperature stabilization can be necessary to avoid feedover.

It should be noted that the geometry shown in FIG. 15 is only one possible implementation. For example, the surface A in some cases could be made as a flat tilted surface. The surfaces B and D could be provided with orientations directed to the outside, either to facilitate release of the molded first housing part or to act as an optical prism.

The precise choice of the geometry depends on the core diameter and the numerical aperture of the optical fiber. More exactly, the numerical aperture dictates the maximum angle of incidence of the beam on the fiber. Therefore the following applies: The smaller the numerical aperture, the more accurate the control or monitoring of the reflector geometry during assembly.

The invention claimed is:

1. An optoelectronic transceiver which has the following:
   a) an optical transmitter,
   b) an optical receiver,
   c) coupling means consisting of a first and second optical lens made with optically active interfaces for changing/deflecting optical paths of on the one hand optical output signals A of the optical transmitter to a connectable optical light guide and on the other hand of input signals E of the same light guide to the receiver, characterized in that the first lens has a concave reflection surface which lies inside in the coupling means for signals of the optical transmitter and the second lens has a convex transmission surface which lies outside for outgoing signals of the optical transmitter and a concave reflection surface which lies inside for incoming signals.

2. The transceiver as claimed in claim 1, wherein the material which forms the coupling means defines or fixes the position of the lenses to one another.

3. The transceiver as claimed in claim 1, wherein the material has an index of refraction of >1.3 and the inner surface of the second lens is made with a radius of curvature such that the condition of total reflection is satisfied with reference to the optical paths of optical signals which are incident on the interface from the light guide.

4. The transceiver as claimed in claim 1, wherein the material which has an index of refraction of >1.3 [sic], and the inner surface of the first lens is made with a radius of curvature such that the condition of total reflection is satisfied with respect to optical paths of optical signals which are incident on the interface from the transmitter.

5. An optoelectronic transceiver which has the following:
   a) an electrical-optical transmitter which emits optical signals to an input/output end face of a light guide and/or
   b) an optical-electrical receiver which receives optical signals and converts them into electronic signals,
   c) a component carrier on which the transmitter and/or receiver is/are located, and one housing part which surrounds the transmitter and/or receiver and which has coupling means which form optical coupling means and mechanical coupling means, the optical coupling means routing or coupling the optical signals coming from the electrical-optical transmitter to the input end face of the light guide and/or routing or coupling the optical beams emerging from the input/output end face of the light guide to the optical-electrical receiver, the mechanical alignment means aligning the light guide with respect to the electrical-optical transmitter and/or the optical electrical receiver for efficient signal transmission, the optical coupling means forming a first reflection interface for the optical signals coming from the transmitter, a second reflection interface for the optical signals emerging from the light guide and furthermore a first and second transmitter surface for the optical signals coming from the transmitter.

6. The optoelectronic transceiver as claimed in claim 5, characterized in that the housing part is formed preferably by an overmold injection method and is connected to the component carrier or its material by the injection method.

7. The optoelectronic transceiver as claimed in claim 5, wherein the housing part forms a mechanical alignment means which aligns one light guide and thus the input/output surface of the light guide with the optical signals which have been reflected from the reflection interfaces.

8. The optoelectronic transceiver as claimed in claim 5, that the plastic material, especially the overmold material is transparent and has an index of refraction n>1.3, preferably n=1.5.

9. The optoelectronic transceiver as claimed in claim 5, that the mechanical coupling means is made in the form of alignment means for the light guide in the housing part, preferably the alignment means being made in the form of a V-groove which preferably has side surfaces which run obliquely to one another.

10. The optoelectronic transceiver as claimed in claim 6, wherein the plastic material forms a reflection interface on the transition between the plastic material and air above the optical transmitter such that the light emerging from the optical transmitter is reflected by the first and second transmission surface onto the input end face of the light guide, and specifically is preferably collimated.

11. The optoelectronic transceiver as claimed in claim 6, wherein the housing part consists made [sic] of highly transparent plastic, and when the first housing part is formed with a material of a second housing part, it assumes a mechanical connection, the second housing part being a carrier for an optical element and optionally other components or electrical circuits.

12. The optoelectronic transceiver as claimed in claim 6, wherein the component carrier is a punched component carrier, preferably a lead frame.

13. The optoelectronic transceiver as claimed in claim 6, wherein the overmold plastic material which forms the housing part, two reflectors or reflection mirrors which each form one reflection surface for the light which can be transmitted between the optical elements positioned on the component carrier and the entry end face of one light guide (and optionally vice versa) [sic], preferably the reflection mirrors which form the reflection surfaces being an internal conical total reflection mirror, the plastic on its interface to the ambient air forming the reflection mirror as a result of the transition from the plastic material with a higher index of refraction to the air with an index of refraction of 1.

\* \* \* \* \*